United States Patent
Bellaouar et al.

(10) Patent No.: US 6,525,521 B2
(45) Date of Patent: Feb. 25, 2003

(54) SAMPLE AND HOLD PHASE DETECTOR HAVING LOW SPURIOUS PERFORMANCE AND METHOD

(75) Inventors: Abdellatif Bellaouar, Dallas, TX (US); Ahmed R. Fridi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/790,377

(22) Filed: Feb. 22, 2001

(65) Prior Publication Data

US 2002/0039020 A1 Apr. 4, 2002

Related U.S. Application Data

(60) Provisional application No. 60/226,184, filed on Aug. 18, 2000.

(51) Int. Cl.[7] ............................................. G01R 13/34
(52) U.S. Cl. ........................................ 324/76.58; 327/9
(58) Field of Search ..................... 324/76.52, 76.58, 324/76.66, 76.15, 76.24, 76.38, 76.42; 327/7, 9, 39

(56) References Cited

U.S. PATENT DOCUMENTS

| | | | |
|---|---|---|---|
| 3,641,258 A | | 2/1972 | Steckler |
| 3,992,660 A | * | 11/1976 | Kawashima et al. ........... 321/6 |
| 4,216,396 A | | 8/1980 | Balaban et al. |
| 4,361,769 A | * | 11/1982 | Hatchett et al. ............. 307/353 |
| 4,810,904 A | | 3/1989 | Crawford |
| 5,057,793 A | * | 10/1991 | Cowley et al. ............. 331/1 A |
| 5,483,154 A | * | 1/1996 | Chen ....................... 327/76.66 |
| 5,483,687 A | * | 1/1996 | Barrett et al. ............. 455/183.2 |
| 5,838,180 A | * | 11/1998 | Partyka ....................... 327/157 |

* cited by examiner

*Primary Examiner*—Christine Oda
*Assistant Examiner*—Etienne P LeRoux
(74) *Attorney, Agent, or Firm*—Pedro P. Hernandez; W. James Brady, III; Frederick J. Telecky, Jr.

(57) ABSTRACT

A method for lowering the spurious output of a sample and hold phase detector includes the steps of charging a ramp node (502) to a first voltage level after a sample period (606) has occurred. After the ramp node (502) is charged to the first voltage level, the ramp node is charged to a second voltage level during period (610). By precharging the ramp node (502) during the hold period (614), it reduces any leakage current in the SH switch (514), which minimizes any voltage drift thereby improving the spurious performance of the SH phase detector (500).

10 Claims, 3 Drawing Sheets

SAMPLE AND HOLD PHASE DETECTOR HAVING LOW SPURIOUS PERFORMANCE AND METHOD

CROSS-REFERENCE TO RELATED APPLICATIONS

This application claims the benefit of U.S. Provisional Application No. 60/226,184, entitled "Sample and Hold (SH) phase detector with low-spurious performance", and filed on Aug. 18, 2000.

TECHNICAL FIELD

This invention relates in general to the field of phase detectors and more specifically to a sample and hold phase detector with low spurious performance and method.

BACKGROUND

The design of sample and hold phase detectors for high-performance frequency synthesizers is a key for low spurious (reference feedthrough) frequency synthesizer designs. In FIG. 1 there is shown a typical phase lock loop (PLL) 100 using a SH phase detector 102. If the SH phase detector 102 is not perfect then spurs will show up in the output signal ($f_{out}$) 104. The offset frequencies of these spurs are multiples of the reference frequency ($F_R$) 106.

A simplified electrical model schematic of a prior art SH phase detector 200 using the PLL of FIG. 1 is shown in FIG. 2. While in FIG. 3, the waveforms for $V_R$, $V_{SH}$ and $V_{PR}$ are shown. The $V_R$ signal is the ramp control voltage, the $V_{SH}$ signal is the sample and hold pulse, and the $V_{PR}$ signal is the pre-charge signal. It should be noted that the conventional digital block, which generates these signals, is not shown in FIG. 2. SH phase detector 200 includes a ramp current generator 204, a ramp capacitor, $C_R$ 206, a sample and hold switch 208, a sample and hold capacitor, $C_{SH}$ 210 and buffer 212.

If the SH phase detector 200 is implemented in complimentary metal-oxide semiconductor (CMOS) using a deep sub-micron CMOS process as an example, the SH phase detector 200 will leak a current during the hold period. Line 302 in FIG. 3 shows an ideal constant voltage level at node N 202 while the SH phase detector 200 is in the hold or locked condition. However, line 304 shows the actual voltage level at node N 202 due to leakage current. This leakage current causes a voltage drift which causes unwanted spurs to be generated by the synthesizer that uses the SH phase detector 200. The leakage current can be large, typically in the order of one nano-amp if the SH switch 208 has low threshold voltage ($V_T$) devices operating at high temperature.

In FIG. 4, there is shown a typical prior art CMOS switch implementation. For the example shown in FIG. 4, the leakage current ($I_{Leak}$) will happen during the phase detector hold period 306. The PMOS device 402 has a $V_{GS}$=0 and an $|V_{DS}|=V_{CC}-V_N$.

Since a typical prior art SH phase detector has a typically long hold period, for example, for a 200 KHz compare frequency [R, V signals], $t_{hold}$ is approximately 5 microseconds using a capacitor ($C_{SH}$)=5 pF. The $\Delta V$ 308 due to leakage is equal to: $\Delta V=[I/C]\times[t]=(1 \text{ nA}/5 \text{ pF})\times(5 \text{ uS})=1$ millivolt. This $\Delta V$ during lock can cause spurs at $f_{out}+/-200$ kHz as large as −20 dBc (without the filter attenuation). The NMOS device 402 shown in FIG. 4 will not suffer because it's $V_{GS}$ is $-V_N$ and the leakage current is too low. The leakage current 404 problem can be much more sever than other issues associated with SH phase detectors including clock feedthrough and charge injection due to the CMOS switch.

Conventional sample and hold (SH) phase detectors used in frequency synthesizers sometimes also suffer from voltage glitches during lock. One reason for this problem is the leakage current of the sampling switch which results in charge leakage in the holding capacitor. A need exists in the art for method of reducing the leakage current in a SH phase detector and hence improves the reference feedthrough issue in the frequency synthesizer using the SH phase detector.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
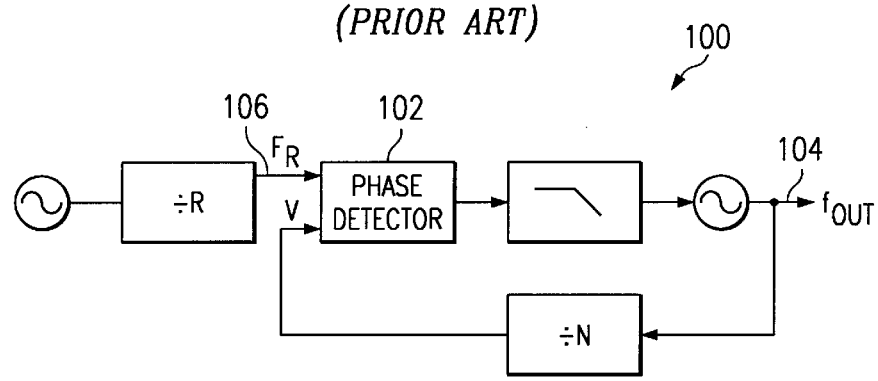
FIG. 1 shows a prior art phase lock loop (PLL) using a SH phase detector.
Figure 2:
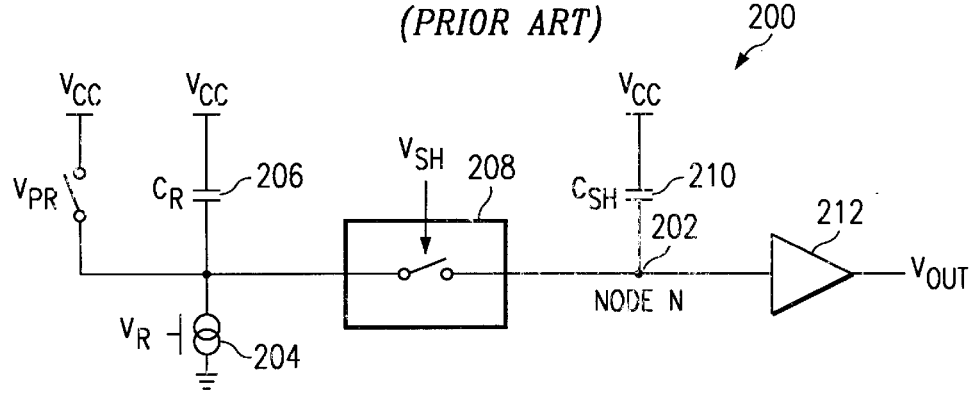
FIG. 2 shows a prior art SH phase detector.
Figure 3:
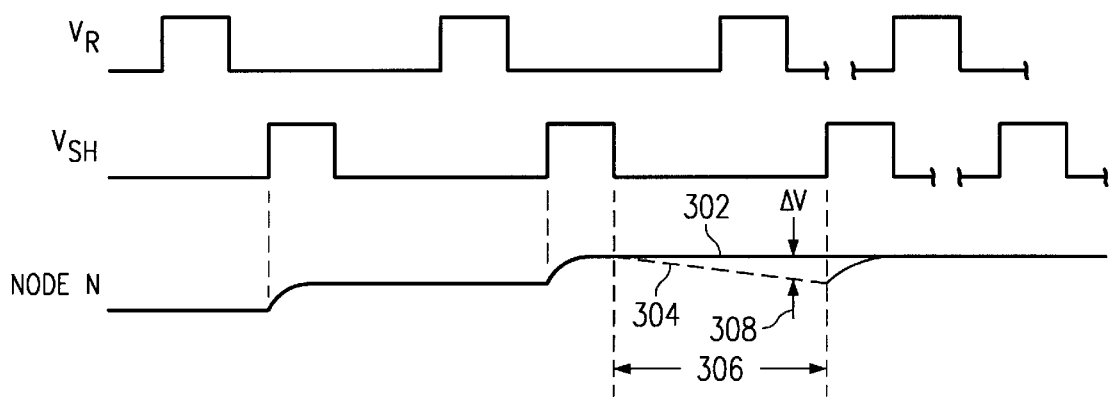
FIG. 3 shows signal waveforms for the SH phase detector shown in FIG. 2.

While the specification concludes with claims defining the features of the invention that are regarded as novel, it is believed that the invention will be better understood from a consideration of the following description in conjunction with the drawing figure.

The present invention describes a procedure which reduces the problem of leakage current in SH phase detectors. The basic idea is to adjust the voltage (e.g., the $V_{GS}$ of the PMOS device 508 shown in FIG. 5 in the preferred embodiment) during the hold period 614 shown in FIG. 6, and just slightly before the ramp (ramp voltage signal $V_R$) starts 612.

Figure 4:
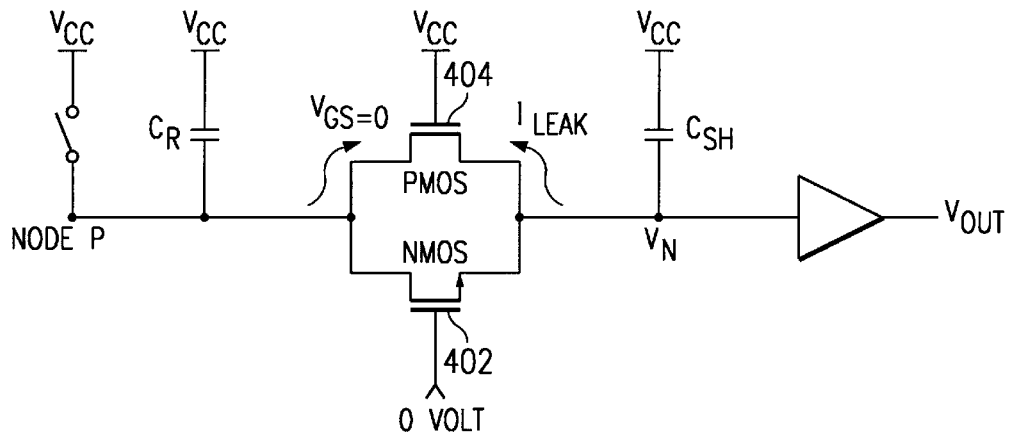
FIG. 4 shows the SH phase detector of FIG. 2 and highlighting the leakage current.
Figure 5:
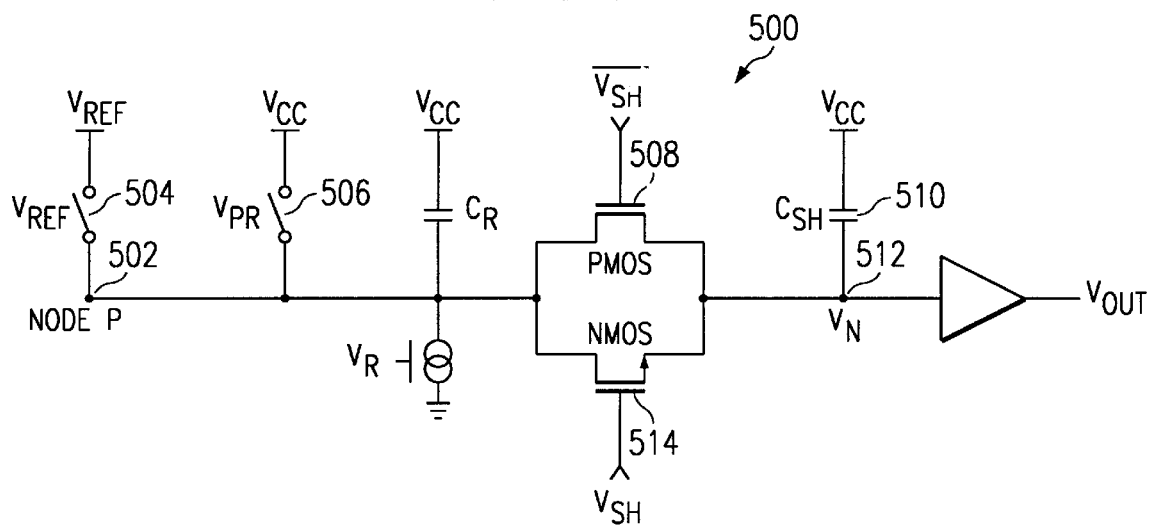
FIG. 5 shows an electrical model schematic of a SH phase detector in accordance with the invention.
Figure 6:
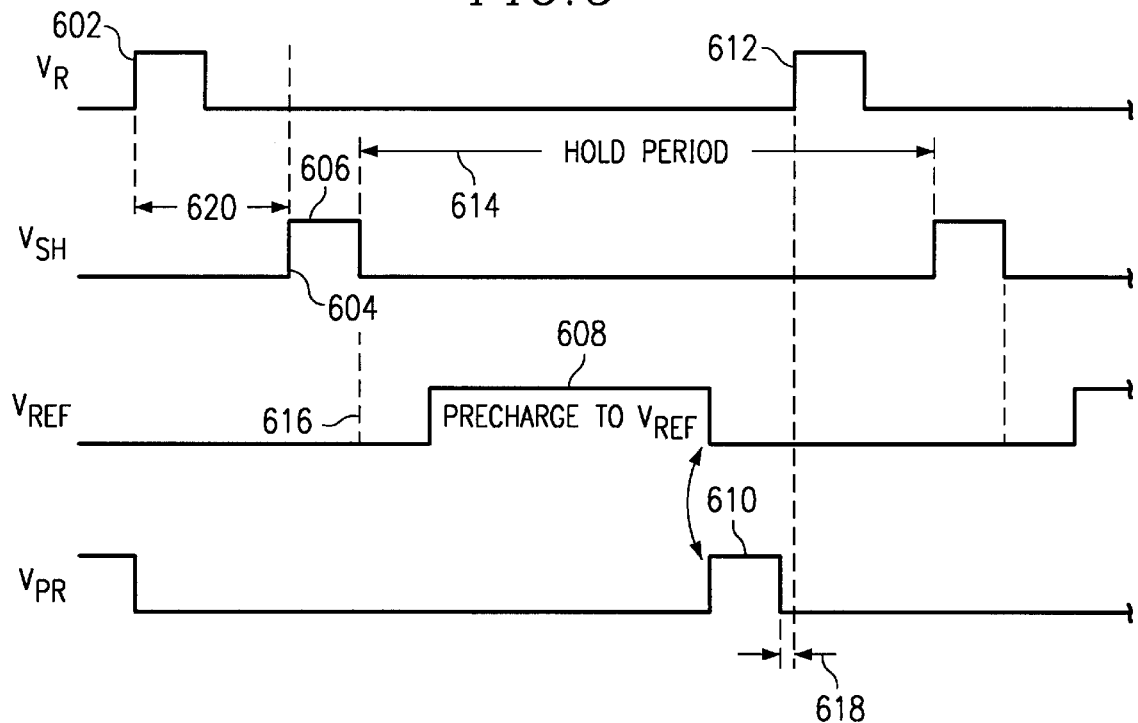
FIG. 6 shows the voltage waveforms for the SH phase detector shown in FIG. 5 in accordance with the invention.

An electrical model schematic of a proposed SH phase detector 500 in accordance with the invention is shown in FIG. 5, while the corresponding voltage waveforms are shown in FIG. 6. A precharge node (e.g., node P in FIG. 4) shown in FIG. 5 as node P 502 is coupled to the input of the SH switch 514. After the SH phase detector is finished sampling (after $V_{SH}$ goes low at point 616), the ramp node, node P 502, is pre-charged to $V_{REF}$ ($V_{REF}<V_{CC}$) by closing switch 504 during the $V_{REF}$ precharge period 608. A practical example would have $V_{REF}=V_{CC}-0.3$ volts. In this example, the $V_{GS}$ of the PMOS switch 508 is positive and the leakage current is reduced drastically. Slightly before, shown by time period 618, the ramp control voltage ($V_R$) at point 612 is triggered, the node P 502 is precharged to $V_{CC}$ during period 610 ($V_{PR}$ logic high, switch 506 closed), to start a new ramping period.

An illustrative example of a SH phase detector which uses the procedure of the present invention is now discussed. For a SH phase detector having a 200 KHz $V_R$ and $V_{SH}$ frequencies (period of 5 microseconds), the time period 620 between the rising edge 602 of the ramp voltage, $V_R$, and the rising edge 604 of $V_{SH}$ is about 45 ns (nano-seconds). The pulse width 606 Of $V_{SH}$ can be 5 ns. The precharge time 610 to Vcc is approximately 100 nanoseconds, while the precharge time 608 to Vref is equal to [5 μs−(45 ns+5 ns+100 ns)]=4.85 μs.

Typically, the leakage current occurs only through the PMOS switch 508, so the precharging technique of the present invention is very beneficial in reducing spurs. The voltage range at node N ($V_N$) 512 for the SH phase detector 500 is in the range of 0.5 V to $V_{CC}$ in this application. In one particular illustrative design, spurs were reduced 20–30 dB compared to the same SH phase detector that did not use the present invention's precharging technique.

Figure 7:
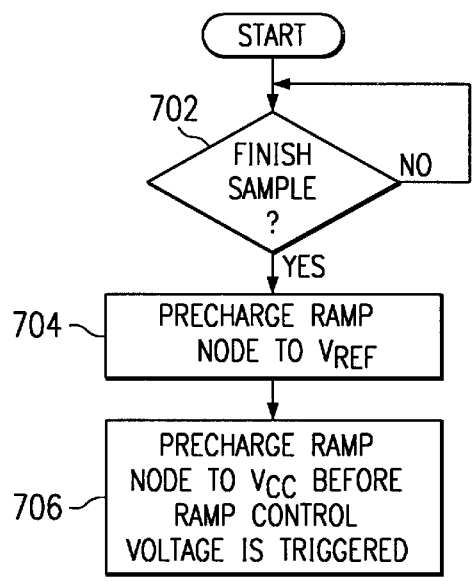
FIG. 7 shows a simplified flowchart highlighting the steps taken in accordance with the invention.

In FIG. 7, there is shown a simplified flow chart highlighting the steps taken in accordance with the preferred embodiment of the invention. In step 702, it is determined if a sample period has ended. If a sample period has ended, immediately or slightly thereafter, in step 704 the ramp node (node P 502) is charged to a first voltage level, which in this particular case is equal to $V_{REF}$. In step 706, the ramp node is precharged to a second voltage level, which in this case is equal to $V_{CC}$.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, although the preferred embodiment showed using a PMOS device 508 in the SH switch 514, other device types can be used causing the precharge voltage level to be different.

What is claimed is:

1. A method for reducing spurs in a sample and hold phase detector having a ramp node coupled to a sample and hold switch and a holding capacitor coupled to the sample and hold switch, the method comprising the steps of:

(a) precharging the ramp node to a first voltage level after a sample period has occurred and during the hold period of the sample and hold phase detector in order to reduce leakage current from the sample and hold switch; and (b) charging the ramp node to a second voltage level that is higher than the first voltage level after step (a).

2. A method as defined in claim 1, wherein the sample and hold switch comprises a PMOS switch and the precharging in step (a) causes the $V_{GS}$ of the PMOS switch to be positive thereby reducing the leakage current through the PMOS switch.

3. A method as defined in claim 1, comprising the further step of:

(c) starting a new ramping period after step (b).

4. A method as defined in claim 1, wherein step (b) is also performed during the hold period of the sample and hold phase detector.

5. A method as defined in claim 4, wherein step (a) is longer in duration than step (b).

6. A method as defined in claim 5, wherein step (b) is performed immediately after step (a) is completed.

7. A sample and hold phase detector, comprising:

a ramp node;

a sample and hold switch coupled to the ramp node, a holding capacitor coupled to the sample and hold switch; and wherein the ramp node is precharged to a first voltage level after a sample period has occurred in order to reduce leakage current through the sample and hold switch during the hold period of the sample and hold phase detector and the ramp node is then charged to a second voltage level that is higher than the first voltage level after the ramp node has reached the first voltage level.

8. A sample and hold phase detector as defined in claim 7, wherein the sample and hold switch comprises a PMOS switch and the precharging the ramp node causes the $V_{GS}$ of the PMOS switch to be positive thereby reducing the leakage current through the PMOS switch.

9. A method as defined in claim 7, wherein the sample and hold phase detector starts a new ramping period after the ramp node has reached the second voltage level.

10. A method as defined in claim 7, wherein the ramp node is charged to the first and second voltage levels during the hold period of the sample and hold phase detector.

* * * * *